US008835868B2

(12) United States Patent　　(10) Patent No.: US 8,835,868 B2
　　Touya et al.　　　　　　　　　(45) Date of Patent: Sep. 16, 2014

(54) MULTI CHARGED PARTICLE BEAM WRITING APPARATUS

(71) Applicant: NuFlare Technology, Inc., Yokohama (JP)

(72) Inventors: Takanao Touya, Kanagawa (JP); Munehiro Ogasawara, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/108,844

(22) Filed: Dec. 17, 2013

(65) Prior Publication Data

US 2014/0175302 A1　Jun. 26, 2014

(30) Foreign Application Priority Data

Dec. 26, 2012　(JP) ................. 2012-282716

(51) Int. Cl.
　　*H01J 3/07*　　　(2006.01)
　　*H01J 37/141*　　(2006.01)
　　*G21K 5/04*　　　(2006.01)
　　*H01J 37/317*　　(2006.01)
(52) U.S. Cl.
　　CPC .......... *H01J 37/3177* (2013.01); *Y10S 430/143* (2013.01)
　　USPC ................. 250/396 R; 250/492.2; 250/492.3; 250/492.22; 250/397; 430/296; 430/942
(58) Field of Classification Search
　　CPC .............. H01J 37/3177; H01J 37/3174; H01J 37/3007; H01J 37/145
　　USPC .......... 250/396 R, 492.2, 492.3, 492.22, 397, 250/296; 430/296, 942
　　See application file for complete search history.

(56) References Cited

U.S. PATENT DOCUMENTS 5,793,041 A　8/1998　Ogasawara et al.
5,864,142 A　1/1999　Muraki et al.
(Continued)

FOREIGN PATENT DOCUMENTS

JP　　9-330867 A　　12/1997
JP　　11-54412 A　　2/1999
(Continued)

OTHER PUBLICATIONS

U.S. Appl. No. 14/066,940, filed Oct. 30, 2013, Matsumoto, et al.
(Continued)

*Primary Examiner* — Nikita Wells
(74) *Attorney, Agent, or Firm* — Oblon, Spivak, McClelland, Maier & Neustadt, L.L.P.

(57) ABSTRACT

A multi charged particle beam writing apparatus includes a stage to mount a target object thereon and to be movable, an emission unit to emit a charged particle beam, an aperture member, in which a plurality of openings are formed, to produce multiple beams by letting a region including the whole of a plurality of openings be irradiated with the charged particle beam and letting portions of the charged particle beam respectively pass through a corresponding opening of a plurality of openings, a reduction optical system to reduce the multiple beams, and a doublet lens, arranged at the subsequent stage of the reduction optical system, in which a magnification is 1 and directions of magnetic fluxes are opposite.

11 Claims, 6 Drawing Sheets

(56) References Cited

U.S. PATENT DOCUMENTS

| | | |
|---|---|---|
| 6,011,268 A | 1/2000 | Nakasuji |
| 7,041,988 B2 | 5/2006 | Hamaguchi et al. |
| 8,067,753 B2 | 11/2011 | Touya |
| 8,362,427 B2 | 1/2013 | Nishimura et al. |
| 8,492,732 B2 * | 7/2013 | Ogasawara ............... 250/396 R |
| 8,586,951 B2 * | 11/2013 | Yoshikawa et al. ...... 250/492.22 |
| 8,610,096 B2 | 12/2013 | Touya |
| 2013/0056647 A1 | 3/2013 | Yoshikawa et al. |
| 2013/0157198 A1 | 6/2013 | Yoshikawa et al. |
| 2013/0214172 A1 | 8/2013 | Touya et al. |
| 2013/0216953 A1 | 8/2013 | Touya et al. |
| 2013/0240750 A1 * | 9/2013 | Touya et al. .............. 250/396 R |
| 2013/0320230 A1 | 12/2013 | Yoshikawa et al. |
| 2014/0061499 A1 * | 3/2014 | Ogasawara et al. ........... 250/400 |

FOREIGN PATENT DOCUMENTS

| | | |
|---|---|---|
| JP | 2003-332207 A | 11/2003 |
| JP | 2006-261342 A | 9/2006 |
| JP | 2013-93566 A | 5/2013 |
| JP | 2014-49545 A | 3/2014 |

OTHER PUBLICATIONS

U.S. Appl. No. 14/108,936, filed Dec. 17, 2013, Touya, et al.
U.S. Appl. No. 14/155,604, filed Jan. 15, 2014, Nakayama, et al.

* cited by examiner

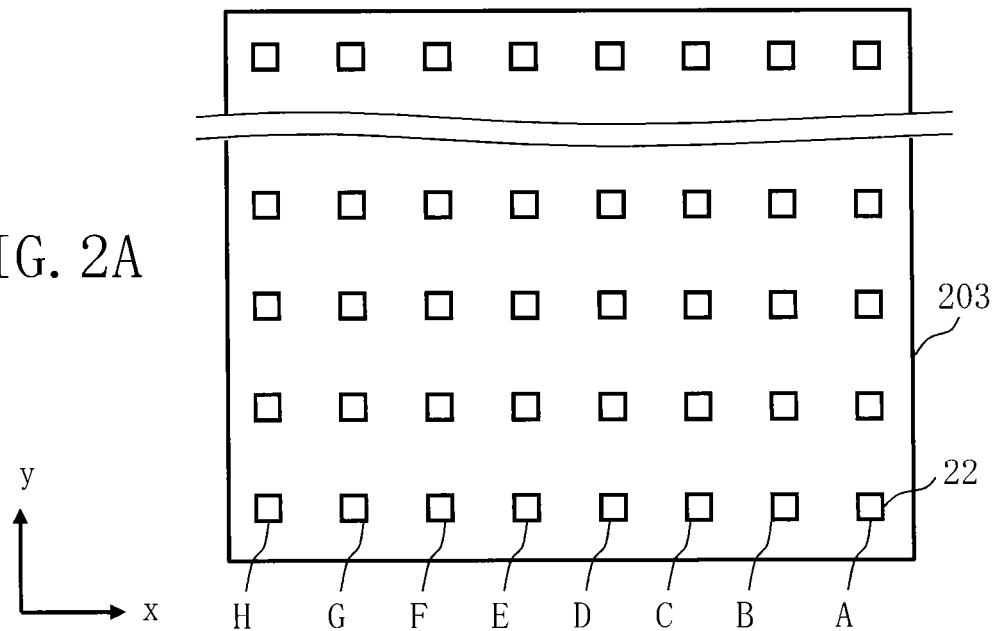
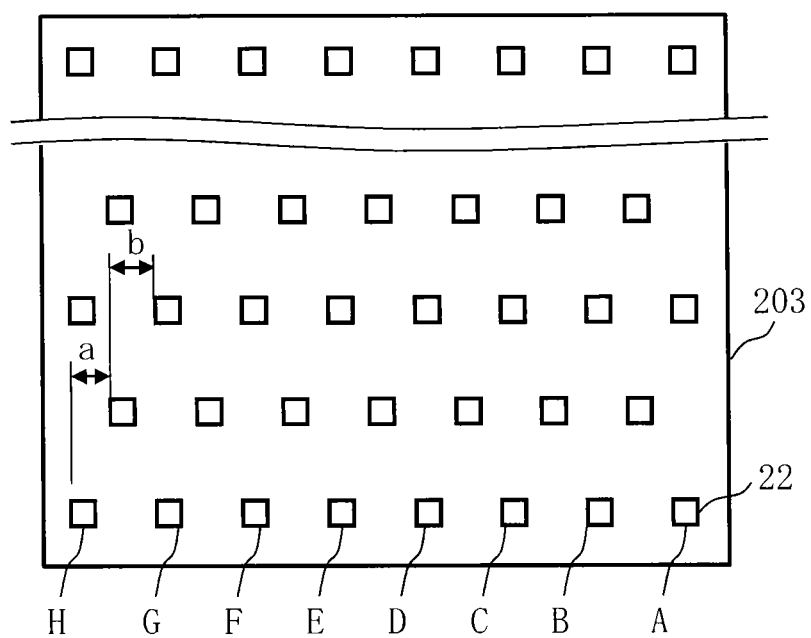

MULTI CHARGED PARTICLE BEAM WRITING APPARATUS

CROSS-REFERENCE TO RELATED APPLICATION

This application is based upon and claims the benefit of priority from the prior Japanese Patent Application No. 2012-282716 filed on Dec. 26, 2012 in Japan, the entire contents of which are incorporated herein by reference.

BACKGROUND OF THE INVENTION

1. Field of the Invention

The present invention relates to a multi charged particle beam writing apparatus, and more specifically, for example, relates to a method of writing a pattern on a target object on the stage by radiating beams.

2. Description of Related Art

The lithography technique that advances miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with an electron beam.

As an example employing the electron beam writing technique, a writing apparatus using multiple beams (multi-beams) can be cited. Compared with the case of writing a pattern by using a single electron beam, since it is possible to emit multiple beams at a time in multiple writing, the throughput can be greatly increased. In the writing apparatus employing a multi-beam system, for example, multiple beams are formed by letting an electron beam emitted from an electron gun assembly pass through a mask with a plurality of holes, blanking control is performed for each of the beams, and each unblocked beam irradiates a desired position on a target object or "sample" (refer to, e.g., Japanese Patent Application Laid-open (JP-A) No. 2006-261342).

In a multi-beam writing apparatus, multiple beams are reduced and transmitted at a high reduction rate by using a reduction optical system composed of a group of lenses, such as a doublet lens. If the number of beams is large like the case of multi-beams, since the region to be reduced and transmitted is also large, it becomes necessary to suppress distortion aberration to be small in order to maintain writing precision. If distortion aberration is made small in the lens group of the reduction optical system, the working distance (WD) becomes short and there occurs a problem that the last lens and other devices using the space between the last lens and the target object surface interfere with each other. Of course, also in the single beam system, this problem will probably be serious as further writing precision is to be required.

BRIEF SUMMARY OF THE INVENTION

In accordance with one aspect of the present invention, a multi charged particle beam writing apparatus includes a stage configured to mount a target object thereon and to be movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a reduction optical system configured to reduce the multiple beams, and a doublet lens, arranged at a subsequent stage of the reduction optical system, in which a magnification is 1 and directions of magnetic fluxes are opposite.

BRIEF DESCRIPTION OF THE DRAWINGS

FIGS. 2A and 2B are conceptual diagrams each showing an example of a configuration of an aperture member according to the first embodiment;

DETAILED DESCRIPTION OF THE INVENTION

In the following embodiment, there will be described a configuration in which an electron beam is used as an example of a charged particle beam. However, the charged particle beam is not limited to the electron beam, and other charged particle beam such as an ion beam may also be used.

Moreover, in the following embodiment, there will be described a writing apparatus in which a working distance can be extended while continuing to suppress a reduction rate and aberration.

First Embodiment

Figure 1:
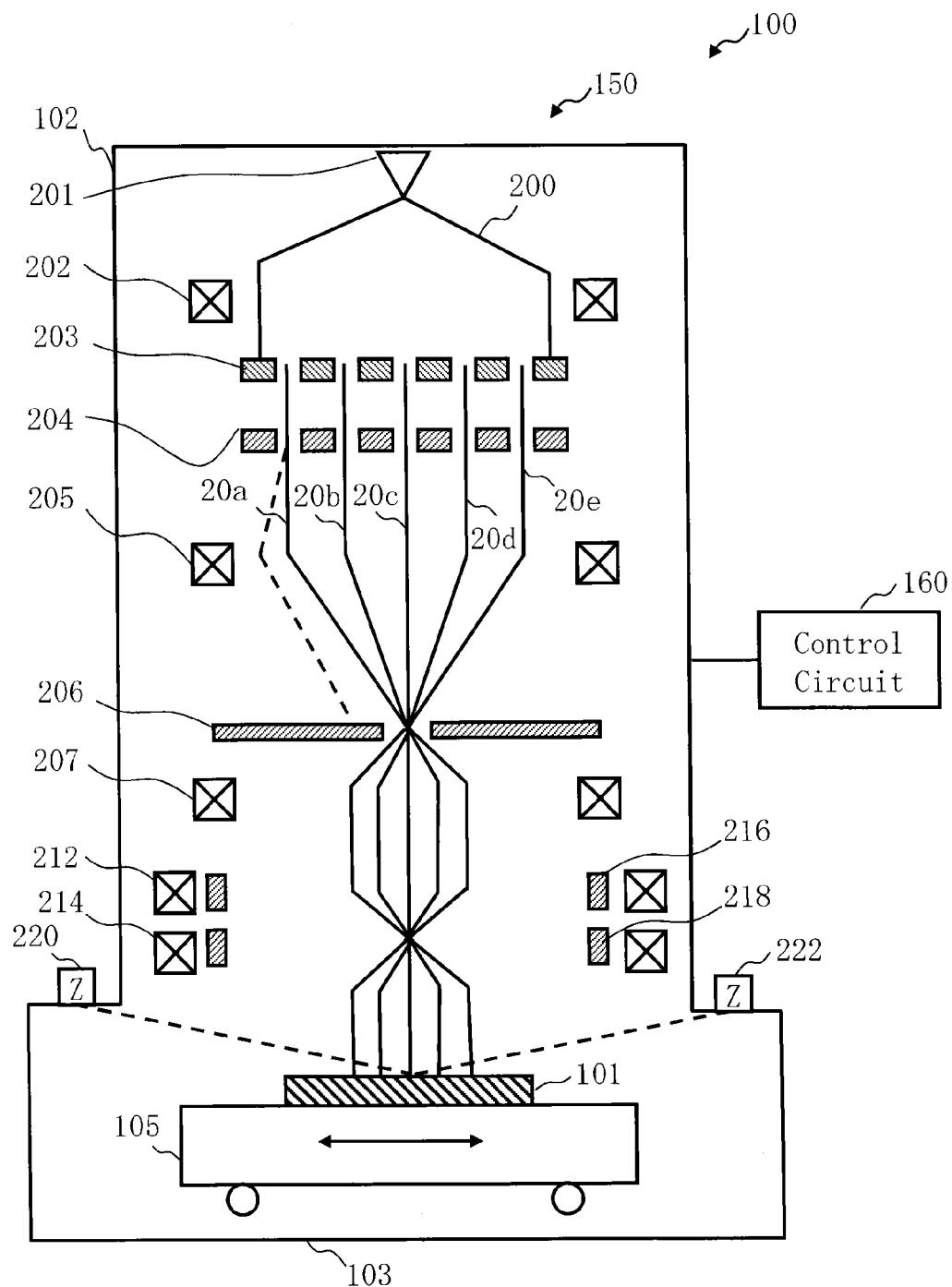
FIG. 1 is a conceptual diagram showing a configuration of a writing apparatus according to the first embodiment.

FIG. 1 is a conceptual diagram showing the configuration of a writing apparatus according to the first embodiment. In FIG. 1, a writing (or "drawing") apparatus 100 includes a writing unit 150 and a control unit 160. The writing apparatus 100 is an example of a multi charged particle beam writing apparatus. Each device configuring the writing unit 150 is driven and controlled by the control circuit 160. The writing unit 150 includes an electron lens barrel 102 and a writing chamber 103. In the electron lens barrel 102, there are arranged an electron gun assembly 201, an illumination lens 202, an aperture member 203, a blanking plate 204, a lens 205, a limiting aperture member 206, an objective lens 207, lenses 212 and 214 configuring a doublet lens, a deflector 216 and an electrostatic lens 218. In the writing chamber 103, there is arranged an XY stage 105, on which a target object or "sample" 101 such as a mask serving as a writing target substrate is placed when performing writing. The target object 101 is, for example, an exposure mask used for manufacturing semiconductor devices, or a semiconductor substrate (a silicon wafer) on which semiconductor elements are formed. The target object 101 may be, for example, a mask blank on which resist is applied and a pattern has not yet been formed. A Z-sensor for measuring a height position (z direction position) of the surface of the target object 101 is arranged on the writing chamber 103 or at the upper part of the writing chamber 103. The Z-sensor includes a projector 220 for emitting laser light beams and an optical receiver 222 for receiving light beams reflected from a measuring object surface (the target object surface, in this case). The illumination lens 202, the lens 205, the objective lens 207, and the lenses 212 and 214 are electromagnetic lenses.

FIG. 1 shows a structure necessary for explaining the first embodiment. Other structure elements generally necessary for the writing apparatus 100 may also be included.

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. The holes 22 are quadrangles of the same dimensions and shape. Alternatively, the holes may be circles of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where the holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
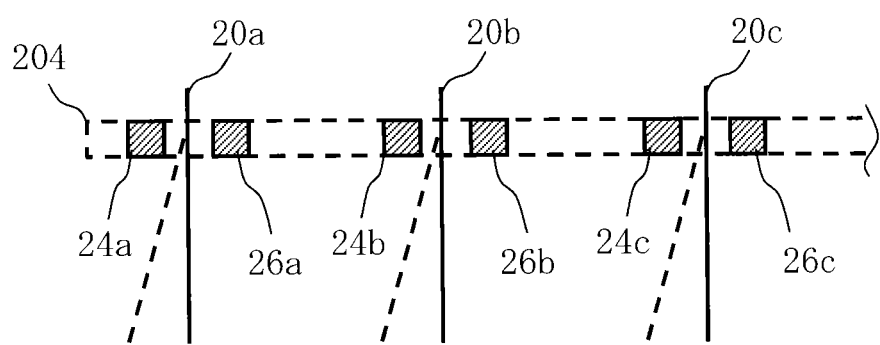
FIG. 3 is a conceptual diagram showing a configuration of a blanking plate according to the first embodiment.

FIG. 3 is a conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: the first deflector) is arranged for each passage hole. The electron beams 20 (multiple beams) respectively passing through a corresponding passage hole are respectively deflected by the voltage applied to the two electrodes 24 and 26 being a pair, and blanking control is performed by this deflection. Thus, a plurality of blankers respectively perform blanking deflection of a corresponding beam in the multiple beams having passed through a plurality of holes 22 (openings) of the aperture member 203.

The electron beam 200 emitted from the electron gun assembly 201 (an emission unit) almost perpendicularly illuminates the whole of the aperture member 203 by the illumination lens 202. A plurality of holes (openings), each being a quadrangle, are formed in the aperture member 203. The region including all the plurality of holes of the aperture member 203 is irradiated with the electron beam 200. For example, a plurality of quadrangular electron beams (multiple beams) 20a to 20e are formed by letting parts of the electron beam 200 pass through a corresponding hole of the plurality of holes of the aperture member 203 respectively. The multiple beams 20a to 20e respectively pass through a corresponding blanker (the first deflector) of the blanking plate 204. Each blanker deflects (performs blanking deflection) each electron beam 20 which respectively passes therethrough. The multiple beams 20a to 20e having passed through the blanking plate 204 are converged by the lens 205, and advance toward a hole at the center of the limiting aperture member 206. At this point, the electron beam 20 which was deflected by the blanker of the blanking plate 204 is deviated from the hole at the center of the limiting aperture member 206 (a blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by each of a plurality of blankers. Then, beam for one shot of multiple beams is formed by a beam which has been formed during from the "beam on" state to the "beam off" state and has passed through the limiting aperture member 206. Pattern images of the multiple beams 20 having passed through the limiting aperture member 206 are focused by the objective lens 207 and collectively deflected by the deflector 216, so as to irradiate respective irradiation positions on the target object 101.

The writing apparatus 100 performs a writing operation by the raster scan method of continuously irradiating shot beams in order while moving the XY stage 105. When writing a desired pattern, a beam necessary in accordance with a pattern is controlled to be "beam on" by blanking control.

Figure 4A:
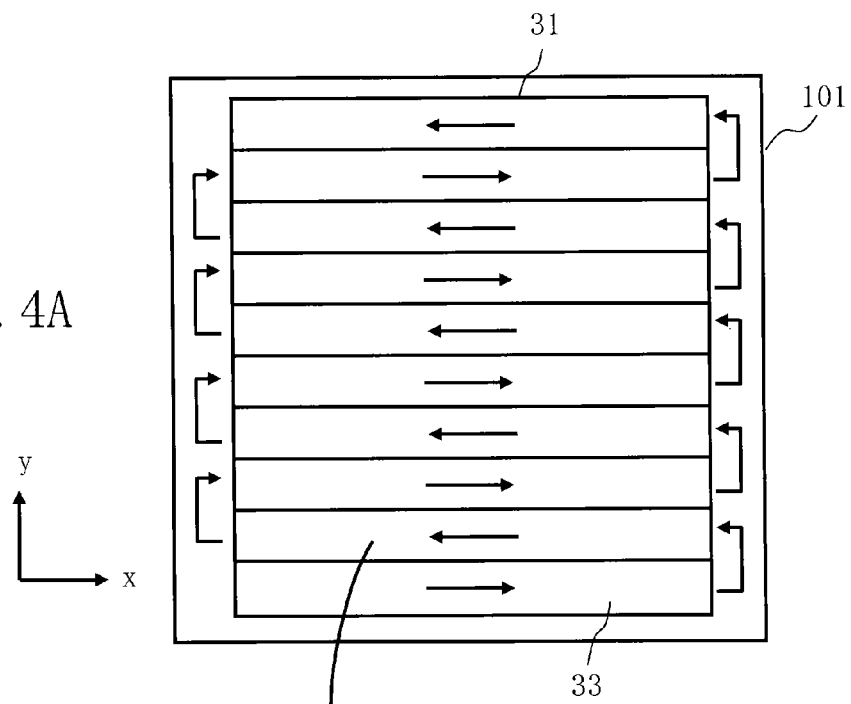
FIGS. 4A to 4C are conceptual diagrams explaining a writing operation according to the first embodiment.
Figure 4B:
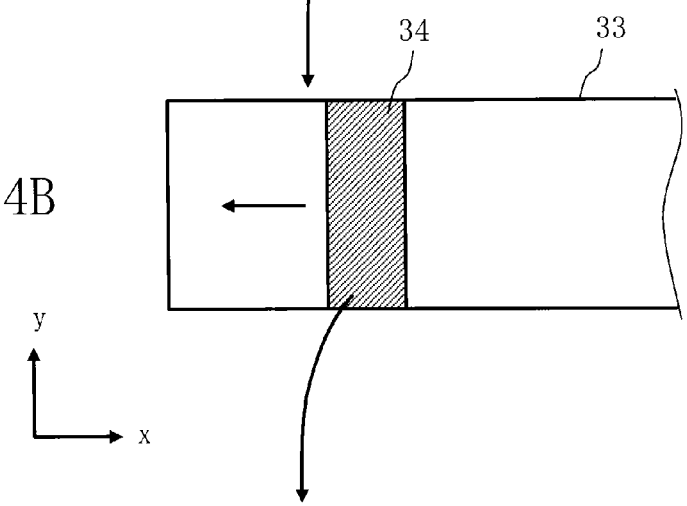
Figure 4C:
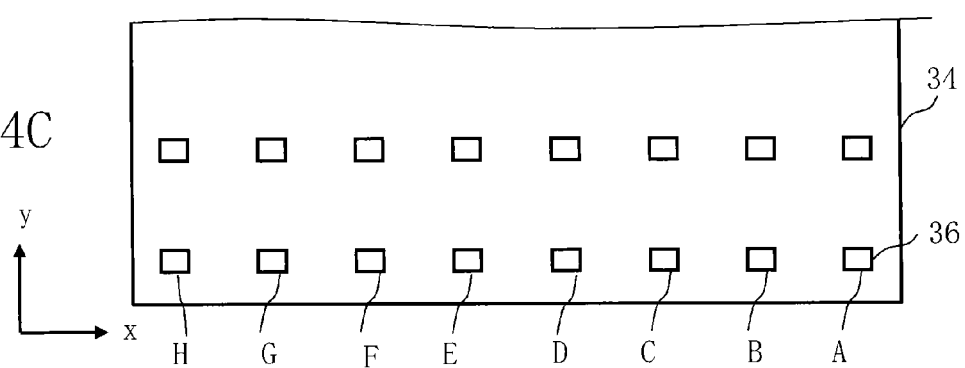

FIGS. 4A to 4C are conceptual diagrams explaining a writing operation according to the first embodiment. As shown in FIG. 4A, a writing region 31 of the target object 101 is virtually divided into a plurality of strip-shaped stripe regions 33 each having a predetermined width in the y direction, for example. Each of the stripe regions 33 serves as a writing unit region. First, the XY stage 105 is moved and adjusted such that an irradiation region 34 to be irradiated with one-time irradiation of the multi-beams 20 is located at the left end of the first stripe region 33 or at a position more left than the left end, and then writing is started. When writing the first stripe region 33, the writing advances relatively in the x direction by moving the XY stage 105 in the −x direction, for example. The XY stage 105 is continuously moved at a predetermined speed, for example. After writing the first stripe region 33, the stage position is moved in the −y direction and adjusted such that the irradiation region 34 is located at the right end of the second stripe region 33 or at a position more right than the right end to be relatively located in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 33, and in the −x direction in the fourth stripe region 33, and thus, the writing time can be reduced. However, the writing operation is not limited to the case of performing writing while alternately changing the direction, and it is also acceptable to perform writing in the same direction when writing each stripe region 33. By one shot, as shown in FIG. 4C, a plurality of shot patterns 36 of the same number as the holes 22 are formed at a time by multiple beams which have been formed by passing through respective corresponding holes 22 of the aperture member 203. For example, a beam which passed through one hole A of the aperture member 203 irradiates the position "A" shown in FIG. 4C and forms a shot pattern 36 at this position. Similarly, a beam which passed through one hole B of the aperture member 203 irradiates the position "B" shown in FIG. 4C and forms another shot pattern 36 at this position, for example. Hereafter, a similar operation is performed with respect to C to H. Moving the XY stage 105 in the x direction, the writing apparatus 100 performs writing of each stripe 33 by the raster scan method that continuously irradiates shot beams in order. Moreover, while the XY stage 105 is moving, irradiation positions of multiple beams are collectively deflected by the deflector 216. The height position (the z direction position) of the surface of the target object 101 changes every second in accordance with minute concave and convex etc. of the surface. Therefore, the height position distribution of the surface of the target object 101 is measured by the Z-sensor, and dynamic focusing of changing a focal position in real time according to the height position distribution is implemented with the electrostatic lens 218 during writing.

Figure 5:
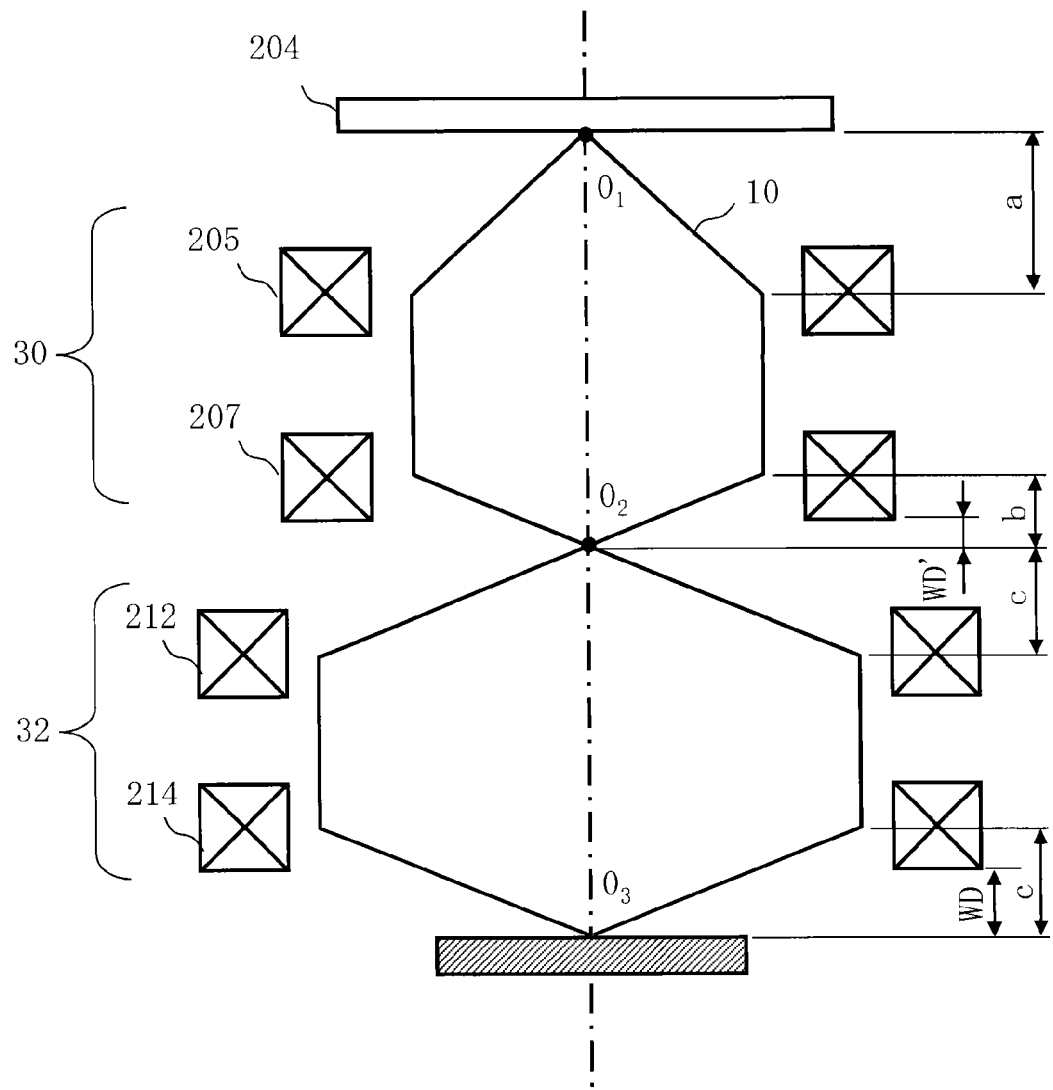
FIG. 5 shows an example of a ray diagram of an optical system and an imaging system according to the first embodiment.

FIG. 5 shows an example of a ray diagram of an optical system and an imaging system according to the first embodiment. In FIG. 5, a doublet lens 30 in the writing apparatus 100 is composed of the lens 205 and the objective lens 207, wherein directions of the magnetic fields are opposite (directions of the magnetic fluxes are opposite), values of excitation (AT: ampere-turn) are equal, and the magnification is n:1 (reduction rate 1/n). The reduction optical system is configured by this doublet lens 30. Owing to the doublet lens 30 in which directions of the magnetic fields are opposite and values of excitation (AT: ampere-turn) are equal, a beam image can be controlled no to rotate. Similarly, a doublet lens 32 is composed of the lenses 212 and 214, wherein directions of the magnetic fields are opposite, values of excitation (AT: ampere-turn) are equal, and the magnification is 1:1 (reduction rate 1/1). Although the example of FIG. 1 shows a trajectory of each beam of multiple beams, the example of FIG. 5 shows a ray diagram of an imaging system of a virtual beam, assuming that multiple beams having passed the blanking plate 204 are one beam. The trajectory of each beam of multi-beams is different from each other, but, however, they have similar imaging system ray diagrams. In FIG. 5, since each beam is not necessarily focused at the height position of the limiting aperture member 206, the limiting aperture member 206 between the lens 205 and the objective lens 207 is not shown in this case. Multi-beams 10 combined at the height position of the blanking plate 204 are bent by the lens 205, regarding the blanking plate 204 as an object point $O_1$, so that they may be parallel beams, and focused at an image point $O_2$ by the objective lens 207. Conventionally, a writing apparatus is configured by regarding the image point $O_2$ of the doublet lens 30 as the surface of the target object 101. Then, the distance between the lower end of the objective lens 207 and the image point $O_2$ (the target object surface) is a working distance WD'. In multibeam writing, the peak intensity of the magnetic field of the objective lens 207 is high in order to increase a reduction rate. Therefore, the distance "b" from the center of height of the objective lens 207 to the image point $O_2$ (the target object surface) is short. On the other hand, since the peak intensity of the magnetic field of the lens 205 is low, the distance "a" from the object point $O_1$ to the center of height of the lens 205 is relatively long compared to the distance "b" at the image point $O_2$ side. Although what is necessary for extending the working distance WD' is to extend the distance "b", it is needed to maintain the ratio between the distance "b" and the distance "a" in order to maintain the reduction rate of the reduction optical system. If the distance "a" is extended in order to extend the distance b, since the distortion aberration becomes large according to simulation, it should be avoided to extend the distance "a". According to simulation, the distortion aberration can be made small by shortening the distance "b" between the center of height of the objective lens 207 and the image point $O_2$ (the target object surface). Consequently, it is needed to extend the working distance without changing the position of the object point $O_1$.

Then, according to the first embodiment, the doublet lens 32 in which directions of the magnetic fields are opposite, values (AT) of the excitation are equal, and the magnification is 1:1 (reduction rate: 1/1) is arranged at the subsequent stage of the doublet lens 30 used as a reduction optical system. At the doublet lens 32, beams are bent by the lens 212, regarding $O_2$ as an object point, so that they may be parallel beams, and focused at an image point $O_3$ (the target object 101 surface) by the objective lens 214. Therefore, according to the first embodiment, the distance between the lower end of the lens 214 and the image point $O_3$ (the target object 101 surface) serves as a working distance WD. If setting the distance "c" from the center of height of the lens 214 to the image point $O_3$ (the target object 101 surface) longer than the distance "b", the working distance WD can be made longer than the working distance WD'. Since the magnification is 1 in the doublet lens 32, peak intensities of the magnetic fields of the lenses 212 and 214 are equal. Therefore, the distance from the object point $O_2$ to the center of height of the lens 212 is the same value, "c", as the distance from the center of height of the lens 214 to the image point $O_3$ (the target object surface). As the suppression of aberration by the doublet lens 30 can be maintained, it is possible to extend the working distance WD while maintaining the situation of the aberration.

Figures 6A, 6B:
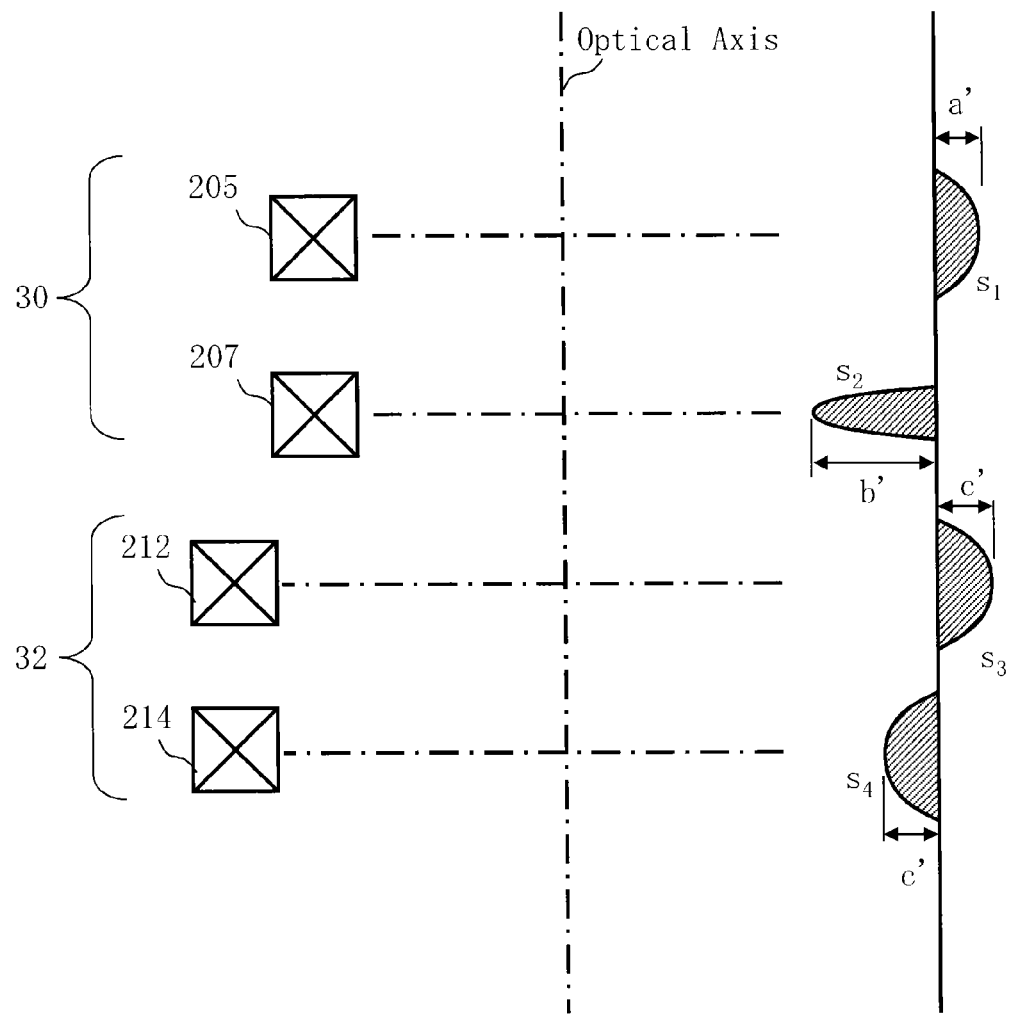
FIGS. 6A and 6B show an example of an optical system and magnetic field intensity according to the first embodiment.

FIGS. 6A and 6B show an example of the optical system and the magnetic field intensity according to the first embodiment. FIG. 6A shows the doublet lens 30 composed of the lens 205 and the objective lens 207, which serve as a reduction optical system, and the doublet lens 32 composed of the lenses 212 and 214, which transmit multi-beams after the reduction, without reducing or enlarging. Here, there is shown one side of cross-sections being symmetrical with respect to the optical axis. FIG. 6B shows the magnetic field of each lens. In the doublet lens 30, as shown in FIG. 6B, values of excitation are set to be equal in order to keep the image not to rotate. Then, it is set such that the value of the area S1 of the magnetic field curve of the lens 205 is the same as that of the area S2 of the magnetic field curve of the objective lens 207. In order to attain a reduction rate of 1/n, the peak intensity b' of the magnetic field of the objective lens 207 is set to be higher than the peak intensity a' of the magnetic field of the lens 205. The reduction rate is proportional to the ratio, being a'/b', of the peak intensities. On the other hand, in the doublet lens 32, values of excitation are also set to be equal in order to keep the image not to rotate. Therefore, it is set such that the value of the area S3 of the magnetic field curve of the lens 212 is the same as that of the area S4 of the magnetic field curve of the lens 214. In the doublet lens 32, the peak intensity c' of the magnetic field of the lens 214 is set to be lower than the peak intensity b' of the magnetic field of the objective lens 207 in order to extend the working distance WD. Thereby, the distance "c" shown in FIG. 5 can be longer than the distance "b". In the doublet lens 32, since the magnification is 1, the peak intensity of the magnetic field of the lens 212 is the same value, c', as that of the magnetic field of the lens 214.

As shown in FIG. 5, when leading the multi-beams 10 focused on the image point $O_2$ by the objective lens 207 to the lens 212, the inner diameter of the doublet lens 32 is set to be greater than that of the doublet lens 30 of the reduction optical system in order to make the distance "c" longer than the distance "b". Therefore, according to the first embodiment, as shown in FIG. 1, the deflector 216 for deflecting the multi-beams onto the surface of the target object 101 can be arranged at the inner diameter side of the doublet lens 32.

Similarly, the electrostatic lens 218 which implements dynamic focusing while performing writing can be arranged at the inner diameter side of the doublet lens 32. Therefore, also in view of this, the installation space can be effectively utilized. Furthermore, since the working distance WD can be increased, it is possible to let the doublet lens 32 not to interfere with the trajectory of a laser light and a reflected light from the Z-sensor. In other words, the doublet lens 32 is arranged at the position that does not interfere with the trajectory of a laser light and a reflected light from the Z-sensor. In addition, since the working distance WD can be increased, it becomes possible to arrange the reflective mirror, etc. of the laser length measuring device that measures a stage position.

As described above, according to the first embodiment, the working distance WD can be increased while continuing to suppress a reduction rate or aberration. Therefore, it is possible to eliminate interference with other devices, etc. using the space between the last lens 214 and the surface of the target object 101 and to perform writing highly precisely even when a region for reducing and transmitting is large, such as in the case of multiple beam writing.

The embodiment has been explained referring to concrete examples described above. However, the present invention is not limited to these specific examples. The raster scanning operation described above is just an example. It is also acceptable to use other operation method instead of the raster scanning operation, using multiple beams. Moreover, although a multi-beam writing apparatus is described in the above examples, it is not limited thereto. As long as there is arranged a group of electromagnetic lenses whose directions of the magnetic fields are opposite, a single beam writing apparatus can also be used to achieve the same effect.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing method and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a stage configured to mount a target object thereon and to be movable;
   an emission unit configured to emit a charged particle beam;
   an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
   a reduction optical system configured to reduce the multiple beams; and
   a doublet lens, arranged at a subsequent stage of the reduction optical system, in which a magnification is 1 and directions of magnetic fluxes are opposite.

2. The apparatus according to claim 1, wherein an inner diameter of the doublet lens is greater than an inner diameter of the reduction optical system.

3. The apparatus according to claim 1, further comprising: a deflector, arranged at an inner diameter side of the doublet lens, configured to deflect the multiple beams onto a surface of the target object.

4. The apparatus according to claim 1, further comprising: an electrostatic lens arranged at an inner diameter side of the doublet lens.

5. The apparatus according to claim 1, further comprising:
   a sensor configured to measure a height position of a surface of the target object by irradiating a laser light onto the surface of the target object and using a reflected light from the surface of the target object,
   wherein the doublet lens is arranged at a position that does not interfere with trajectories of the laser light and the reflected light.

6. The apparatus according to claim 1,
   wherein the reduction optical system has two lenses, further comprising:
   a plurality of blankers, arranged at a stage previous to the reduction optical system, configured to perform blanking deflection of each beam of the multiple beams; and
   a blanking aperture member, arranged between the two lenses of the reduction optical system, configured to block a part of the multiple beams controlled to be in a "beam off" state by blanking control.

7. The apparatus according to claim 1,
   wherein the doublet lens is set such that whose values of excitation are equal.

8. The apparatus according to claim 1,
   wherein the reduction optical system has two lenses whose peak intensities of magnetic fields are set to be different from each other, and
   the doublet lens is arranged at a subsequent stage side of the two lenses whose peak intensities of the magnetic fields are different from each other, and is set such that values of excitation are equal.

9. The apparatus according to claim 8,
   wherein peak intensities of magnetic fields of the doublet lens are set to be lower than a higher one of the peak intensities of the magnetic fields of the two lenses of the reduction optical system.

10. The apparatus according to claim 1 further comprising:
    a plurality of blankers that perform blanking deflection of each beam of the multiple beams; and
    a blanking aperture member configured to block a part of the multiple beams controlled to be in a beam off state by blanking control,
    wherein a deflector, arranged at an inner diameter side of the doublet lens, collectively deflects each beam, having passed the blanking aperture member, of the multiple beams onto the target object.

11. A multi charged particle beam writing apparatus comprising:
    a stage configured to mount a target object thereon and to be movable;
    an emission means for emitting a charged particle beam;
    an aperture means, in which a plurality of openings are formed, for forming multiple beams by letting a region including a whole of the plurality of openings be irradiated with the charged particle beam and letting portions of the charged particle beam respectively pass through a corresponding opening of the plurality of openings;
a reduction optical means for reducing the multiple beams; and
a doublet lens, arranged at a subsequent stage of the reduction optical system, in which a magnification is 1 and directions of magnetic fluxes are opposite.

* * * * *